US012394295B2

(12) United States Patent
Shyamalan

(10) Patent No.: US 12,394,295 B2
(45) Date of Patent: Aug. 19, 2025

(54) SYSTEMS AND METHODS FOR LOW POWER CONSUMPTION GEOFENCING

(71) Applicant: Verizon Patent and Licensing Inc., Basking Ridge, NJ (US)

(72) Inventor: Shyam T Shyamalan, Hillsborough, NJ (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 56 days.

(21) Appl. No.: 18/380,555

(22) Filed: Oct. 16, 2023

(65) Prior Publication Data

US 2025/0124777 A1 Apr. 17, 2025

(51) Int. Cl.
*G08B 21/02* (2006.01)
*G06F 30/27* (2020.01)

(52) U.S. Cl.
CPC ......... *G08B 21/0261* (2013.01); *G06F 30/27* (2020.01); *G08B 21/0269* (2013.01)

(58) Field of Classification Search
CPC .. G08B 21/0261; G08B 21/0269; G06F 30/27
See application file for complete search history.

(56) References Cited

U.S. PATENT DOCUMENTS

| | | | |
|---|---|---|---|
| 7,639,131 B2* | 12/2009 | Mock | G01S 5/019 340/539.3 |
| 11,147,459 B2* | 10/2021 | Sobol | A61B 5/0002 |
| 11,410,074 B2* | 8/2022 | Kwant | G06N 20/00 |
| 11,503,434 B2* | 11/2022 | Sobol | H04W 4/021 |
| 2013/0295970 A1* | 11/2013 | Sheshadri | G01S 19/52 455/456.6 |
| 2014/0266883 A1* | 9/2014 | Lacatus | H04W 52/0209 342/357.63 |
| 2015/0088792 A1* | 3/2015 | O'Neill | G06N 20/00 706/12 |
| 2025/0009237 A1* | 1/2025 | Russek-Sobol | A61B 5/0022 |

* cited by examiner

*Primary Examiner* — John A Tweel, Jr.

(57) ABSTRACT

One or more computing devices, systems, and/or methods for low power consumption geofencing are provided. During a learning phase, a model is generated to determine whether a device is within a geofence. In response to receiving a first lookup location request, location identification logic is used to determine a first device location and a determination is made as to whether the device is within the geofence. First radio signal information associated with determining the first device location is recorded within a training data structure used to create the model. In response to receiving a second lookup location request after the learning phase, the model is used to determine whether the device is within the geofence. An output by the model is used if a confidence level is above a threshold, otherwise, the location identification logic is used.

20 Claims, 9 Drawing Sheets

SYSTEMS AND METHODS FOR LOW POWER CONSUMPTION GEOFENCING

BACKGROUND

Some devices, such as wearable devices, may provide users with the ability to set a geofence. The geofence may correspond to a particular location or some other geographic coordinates or boundary. In an example, a parent may set a geofence for a watch that a child wears. The geofence may be defined based upon a location of a school that the child attends. If the watch leaves the geofence such as where the child leaves the school while wearing the watch, then the device may transmit an alert to the parent. The alert may be sent through an email, a text message, or a push notification to a device of the parent. In another example, a guardian of an elderly individual may set a geofence that corresponds to a nursing home or a home of the individual so that the guardian will receive alerts if a device of the individual leaves the geofence. Other examples may relate to defining geofences for devices attached to items such as products within a warehouse to guard against theft.

BRIEF DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

DETAILED DESCRIPTION OF EXAMPLE EMBODIMENTS

Figure 1A:
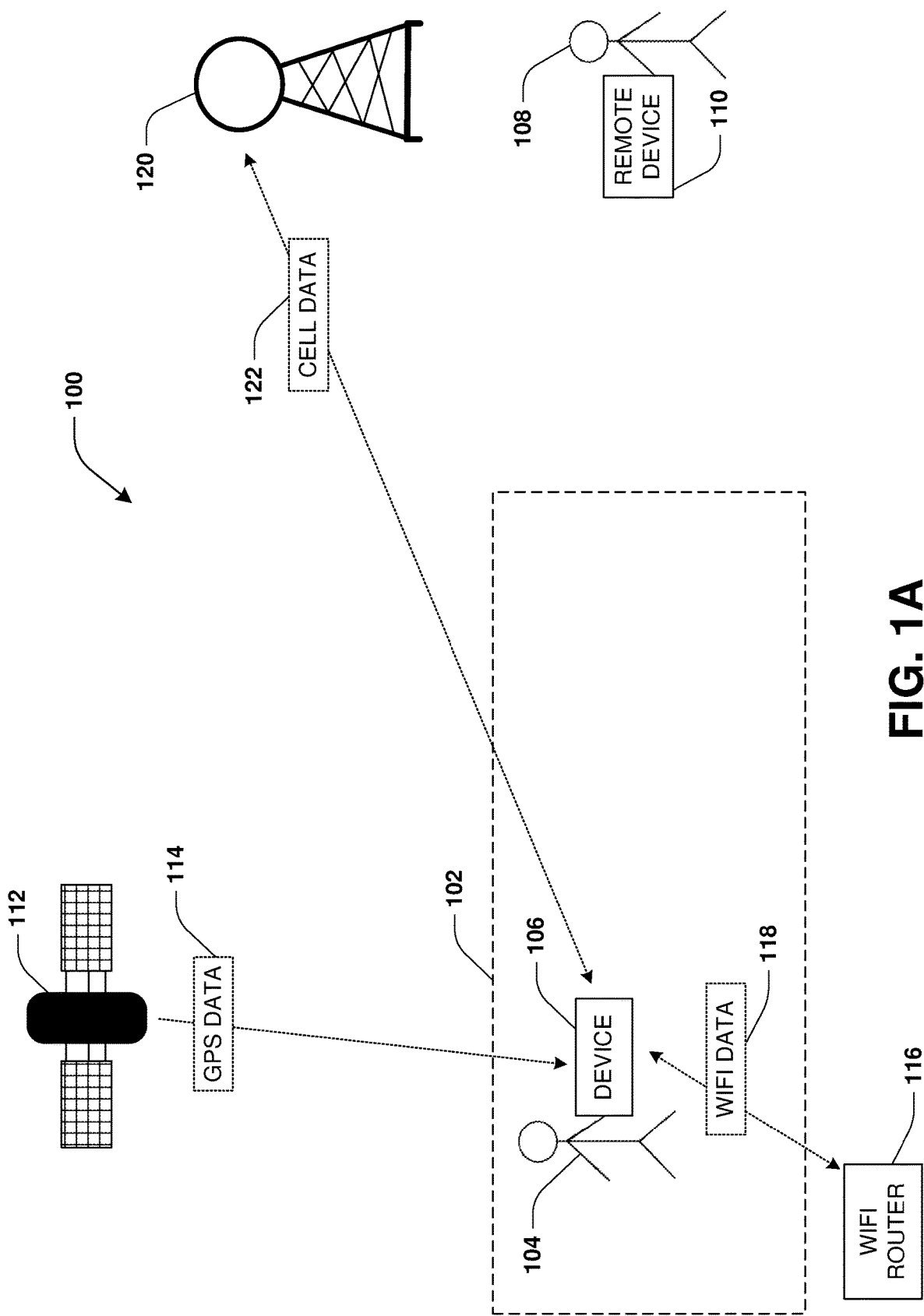
FIGS. 1A-1B illustrate an example of a system for low power geofencing, in accordance with an embodiment of the present technology.

Subject matter will now be described more fully hereinafter with reference to the accompanying drawings, which form a part hereof, and which show, by way of illustration, specific example embodiments. This description is not intended as an extensive or detailed discussion of known concepts. Details that are well known may have been omitted, or may be handled in summary fashion.

The following subject matter may be embodied in a variety of different forms, such as methods, devices, components, and/or systems. Accordingly, this subject matter is not intended to be construed as limited to any example embodiments set forth herein. Rather, example embodiments are provided merely to be illustrative. Such embodiments may, for example, take the form of hardware, software, firmware or any combination thereof. The following provides a discussion of some types of computing scenarios in which the disclosed subject matter may be utilized and/or implemented.

Many devices support a geofence feature where users can set a geofence for a specific location. The geofence is a virtual fence or virtual boundary/perimeter around a physical location. Similar to a physical fence, the geofence creates a separation between that physical location and an area around the physical location. The geofence can also be used to detect movement inside the geofence. The geofence can be any size or shape, or even a straight line between two points. A geofence component executes location identification logic to periodically identify a current location of the device and determine whether the device is located within or outside the geofence. When the geofence component detects that the device is outside the geofence, an alert is generated and transmitted to a user such as through an email, a text message, a push notification to a device of the user, etc.

An issue with determining device location is that the location identification logic may use a significant amount of device power, and devices that implement geofences are typically mobile devices that rely on battery power. For example, the location identification logic may include facilities such as a global positioning system (GPS) component, a Wi-Fi component, a cellular (e.g., 4G, 5G) component, a Bluetooth component, or any other hardware or software of the device used to detect a current location of the device. In order to resolve the location, these facilities may need to energize circuitry and/or perform calculations, and these actions will draw power from the device battery. Some facilities will draw relatively higher power than other facilities that draw relatively lower power, due to the nature of how they operate. For example, use of the GPS component to resolve a device location will draw higher power than using a Bluetooth component to resolve a device location.

Despite the disparities in power consumption, it may be beneficial to use each type of location determination facility because they may each provide other performance benefits such better accuracy, faster resolution time, and/or availability in more locations. As an example, the location identification logic may use multiple location determination components as part of a device location lookup that can happen to check whether a device is within a geofence. The location identification logic may initially use the GPS component, which consumes a relatively high amount of power to operate, but can resolve the location relatively quickly and accurately when GPS radio signals are available. If the device location can be determined by the GPS component to less than or equal to some accuracy threshold (such as 100 m), then the device location based on the GPS signals is used. However, if GPS signals are not available or the accuracy of the location determined from the GPS signals is greater than the accuracy threshold, then a wireless network location component can be used to determine geographic coordinates based on Wi-Fi radio signals (e.g., latitude and longitude coordinates obtained from a Wi-Fi location database). The wireless network component consumes relatively lower power than the GPS component (and Wi-Fi radio signal information may already be available if the device is using Wi-Fi for communication purposes), but Wi-Fi access points may not always be within range of the device and/or location data may not be associated with the access point. If the Wi-Fi signal is available and the accuracy of the determined geographic coordinates is less than or equal to the accuracy threshold, then the location determination from the wireless network component is used.

Continuing the above example, if the wireless network location component does not produce a satisfactory location determination, then a cellular network location component may be used to determine geographic coordinates based on cellular network signals (e.g., through the use of a Secure User Plane Location (SUPL) server), which also consumes relatively lower power than the GPS component and may already be in use for communication purposes, but requires availability of cellular radio signals, and may have lower positional accuracy and requires a longer time period for address resolution. If the cellular network signal is available and the accuracy of the geographic coordinates are less than or equal to the accuracy threshold, then the geographic coordinates are used. Finally, if the results of all prior location determinations fail to meet the accuracy threshold, then the most accurate of the determinations from various location determination facilities may be used for identifying the current location. This is only one example of a possible methodology to obtain a current location; it may be appreciated that other types of components/signals (e.g., Bluetooth) and different orders/sequences of using the various components may be used, depending on the situation and environment.

Devices may employ various mitigations to reduce the amount of power used by location determinations. As one example, a time constraint may be applied that restricts the amount of time the geofence is active, which can be useful to save power during times when geofence monitoring is unnecessary. Another example is varying the frequency of the periodic location lookup depending on whether the device is moving. If the device is detected as not moving (e.g., using device motion sensors such as accelerometers), then the geofence component can reduce the frequency of its requests for a current location, since it is likely its current position has not changed much from its prior position. Another example is varying the frequency based on how close the device is to the geofence boundary. If the device has previously been detected as being far away from the boundary, it is unlikely the device will move quickly enough to go beyond the boundary between location determinations, so the geofence component can reduce the frequency of its requests for location information.

Several problems have been identified with these mitigations, particularly in connection with using geofences in wearable devices used by a child (e.g. a watch or pendant). It is common for a parent to set geofences for their home and school, and the area of these geofences may be relatively small. As a result, the device is frequently near an edge of the geofence, and therefore the frequency of the geofence component requesting a location determination for the device is high. Additionally, the wearable may indicate frequent motion events (children tend to be more active than adults) that would prevent the ability to use lack of motion as a mitigation tool. The size of the device may preclude using a large battery, and therefore the power drain associated with location determinations may have a larger impact on the overall ability to use the device for long periods of time. It may also be inconvenient to perform recharging of the battery except during periods when it is not being worn, and those periods may be infrequent (e.g., only at night).

The techniques provided herein address and overcome these technical problems and improve the operation of geofence enabled devices by reducing power consumption and improving battery life. This is achieved through using a model that "learns" the radio environment of the device in the area of the geofence, such that it can be used to determine (predict) whether the device is within the geofence without needing to use high power location determination techniques (e.g., GPS). A learning phase may be performed to generate (train) a model to determine whether a device is within a geofence. During the learning phase, location lookups for determining whether the device is within the geofence are performed using the location identification logic. In addition, radio signal information (e.g., Wi-Fi signals, cellular signals, Bluetooth signals, etc.) measured by the device are stored within a training data structure for use in training the model. The determinations made by the location identification logic—of whether the device is within the geofence and/or the current location of the device—may also be stored in the training data structure. After a sufficient number of training data structure entries have been made, the model is generated from the stored information according to the model type.

After the learning phase where the model has been generated, the device may use the model to determine the device location without using the high-power location determination facilities. Current radio frequency signal information measurements by the device are applied as inputs to the model, and the model produces as an output that predicts whether the device is within the geofence. In some implementations, a confidence level is also determined for the prediction (or may be part of the prediction), and if the confidence level is below a threshold, the device instead does a location lookup using the location determination logic to determine whether the device is within the geofence. By using the model, the device can still perform geofence boundary detection while avoiding the need to frequently execute location identification logic that consumes significant amounts of power. Accordingly, the model is capable of improving the battery life and operation of the geofence enabled device.

Figure 1B:
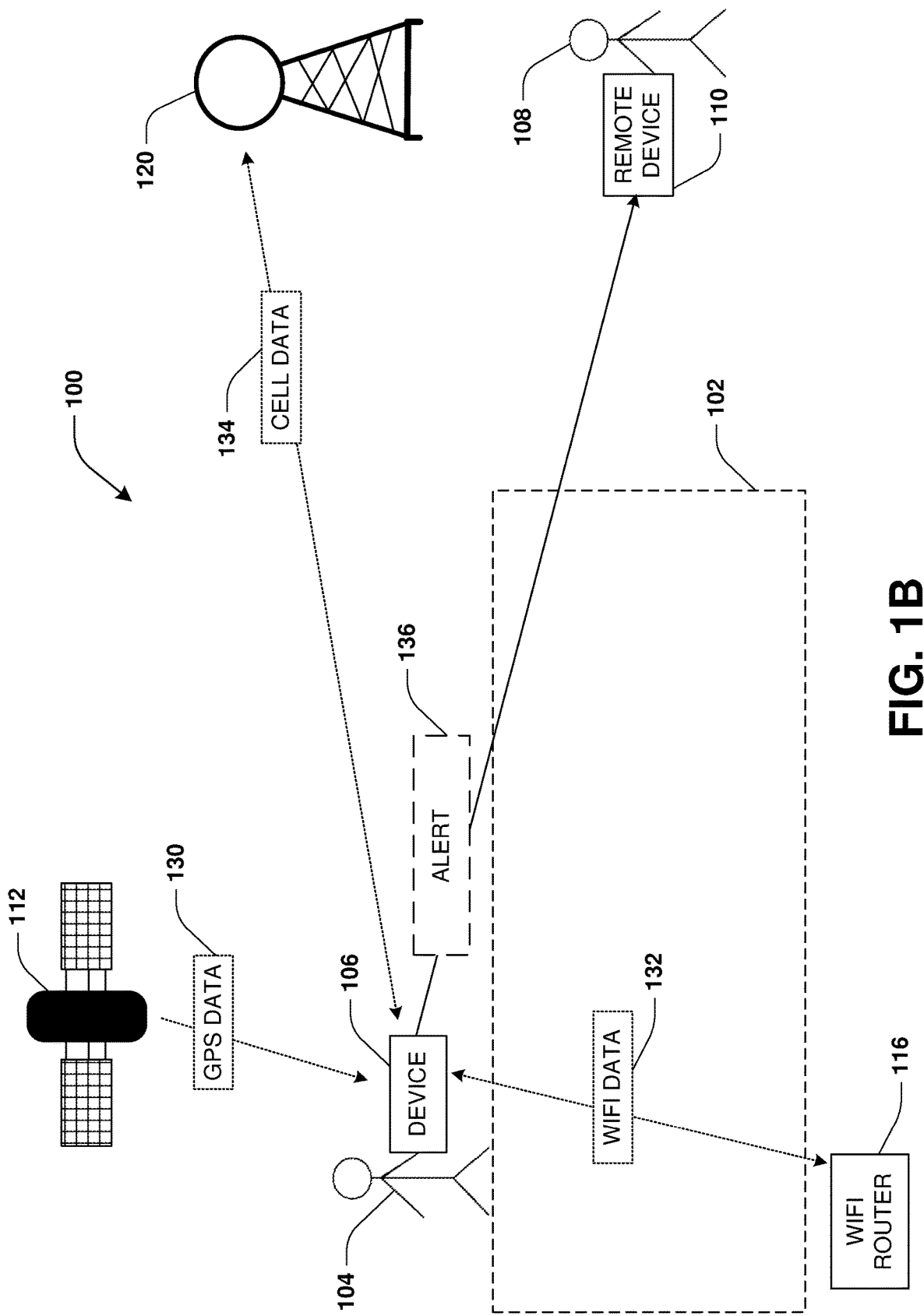

FIGS. 1A-1B illustrate an example of a system 100 for low power geofencing. A device 106 may host a geofence component that provides the ability to enforce one or more geofences for the device 106. A first user 108 (e.g., a parent) may set a geofence 102 as a virtual fence or virtual boundary/perimeter around a physical location (e.g., a school where a second user 104 such as a child attends). If the device 106 is within a geofence 102, then no alert is generated. If the device 106 is outside the geofence 102, then an alert 136 is generated and provided to the first user 108. In order to determine whether the device 106 is within the geofence 102, location identification logic may be executed by the device 106. The location identification logic may include one or more position determination facilities that may be used to determine a current location of device 106 to a specified degree of accuracy. For example, as noted above, the location identification logic may acquire and utilize global positioning system signals 114 (e.g., GPS data) from GPS satellites 112, local wireless network signals 118 (e.g., Wi-Fi, Bluetooth) received by the device 106 from a local wireless networking device 116 (e.g., a Wi-Fi access point), and/or cellular signals 122 (e.g., 4G, 5G cell networks) received by the device from a cellular network device 120 to identify a current location of the device 106. As depicted in FIG. 1A, the geofence component may determine that the current location of the device 106 is within the geofence 102, and thus no alert is generated.

As noted above, execution of some position determination facilities (such as GPS) can consume a significant amount of power, thus draining the battery of the device 106. Accordingly, as described further below, a model is generated (trained) during a learning phase for determining whether the device 106 is within the geofence 102. After the learning phase, the model may be used to determine whether the device 106 is within the geofence 102 without the need to use high power position determination facilities. Depending on implementation, a device may enter the learning phase in various ways. For example, in some implementations, the device will automatically enter a learning phase when a geofence is set. In some implementations, a learning phase may be triggered manually by a user. In some implementations, the learning phase will be entered once the device has entered a location within the geofence. A combination of these may be possible.

As part of performing the learning phase, the location identification logic is executed to service lookup location requests for identifying locations of the device 106 to determine whether the device 106 is within or outside the geofence 102. Additionally, an entry is made in a training data structure (e.g., data structure 500 of FIG. 5) reflecting the radio signal information for radio frequency signals received by the device. The radio signal information may correspond to the local wireless network signals 118 or cellular network signals 122 detected contemporaneously with the location identification logic executing a request to determine whether the device 106 is within the geofence 102. Examples of radio signal information include (but are not limited to): received signal strength data, access point SSIDs, cell IDs, and/or Bluetooth IDs. A timestamp may also be stored with the radio signal information to be able to determine an age of the information, and the geofence ID may be included which may be useful where multiple geofences have been specified for device 106. In some implementations, geographic coordinates associated with the determined location may also be stored in the data structure, which may be used for location predictions (as described below).

As illustrated by FIG. 1B, a subsequent lookup location request may be received during the learning phase. In response to receiving the subsequent lookup location request, the location identification logic may acquire and utilize global positioning system signals 130 (e.g., GPS data), local wireless network signals 132 (e.g., Wi-Fi, Bluetooth), and/or cellular signals 134 (e.g., 4G, 5G) to identify a current location of the device 106, as illustrated by FIG. 1B. The geofence component may determine that the current location of the device 106 is outside the geofence 102 (e.g., the child left the school premises). Accordingly, an alert 136 is generated and transmitted to a remote device 110 for display to the first user 108. In some implementations, radio signal information may be populated within the data structure 500 with an indication that the device 106 was determined to be outside the geofence 102. In other implementations, the radio signal information may be omitted from the data structure 500 as not being within the geofence.

The information in data structure 500 may be used to train a model to perform predictions of device location relative to the geofence. In some implementations, the model may comprise a structured data arrangement of the radio signal information and geofence determinations that allows for lookups of prior results based on current values for one or more of the items of radio signal information (e.g., a search tree). In some implementations, the model may comprise one or more selected machine learning algorithms (e.g., Decision Trees, Support Vector Machines, K-Nearest Neighbor, Random Forest, Linear Regression) trained using a supervised learning process based on the radio signal information and geofence determinations to be able to generate predictions of location. The learning phase may be performed for a period of time to acquire a sufficient amount of radio signal information and geofence determinations to train the model to perform accurate predictions of a device's position relative to the geofence. In some implementations, as part of the learning phase, the model is used to generate test predictions that are compared to actual location identification logic determinations to calculate one or more accuracy metrics associated with the model (e.g., accuracy, precision, sensitivity, specificity, etc.). The learning phase may be completed when one or more of the accuracy metrics meets a threshold requirement.

In some implementations, the model will act as a binary classifier to make predictions of whether the device is inside or outside the geofence based on the stored radio signal information and geofence determinations. In other implementations, the model may perform a regression analysis to predict a likely geographic location of the device based on the stored radio signal information and determined geographic coordinates, and the predicted location is then used to determine whether the device is inside or outside the geofence. In some implementations, both modeling techniques may be used interchangeably depending on available training data, accuracy metrics, processing power, and the like.

In some implementations, the learning phase may include calculating confidence levels associated with predictions. The confidence level may be based on one or more of the amount of radio signal information provided, the size of the geofenced area, and/or the age of the radio signal information.

In some implementations, the learning phase may be repeated in certain circumstances, such as when the positioning of the geofence is altered, when a period of time since the last learning phase was performed, when a battery level of the device is at a sufficiently high level, or when a user manually requests a new learning phase be performed. For example, the information in the data structure 500 may be filtered for entries that are sufficiently recent (e.g., based on timestamps), and if the number of filtered entries is below a threshold level, a new learning phase may be triggered to collect more recent radio signal information and geofence determinations.

Once the learning phase is complete, subsequent lookup location requests from the geofence component are initially routed to the model. The model may use measurements of current radio frequency signals (e.g., Wi-Fi signals, cellular signals, Bluetooth signals, etc.) as inputs to generate a prediction output of whether the device is within geofence. If the prediction output indicates that the device should be within the geofence 102, no further action is needed. If the prediction output indicates that the device is outside the geofence, an alert is generated. If the model output indicates a low degree of confidence in the prediction, the request is then routed to the location identification logic to execute its normal process to determine whether the device 106 is within or outside the geofence 102 using location determination facilities.

In certain situations, with a trained model, a device can be expected to avoid many high-power location determination events, and significantly reduce power consumption. For example, in the case of a child with a watch having two geofences for school and home (where most of the device time will occur), almost all geofence determinations at those locations will be likely be serviceable through a model rather than needing a GPS measurement.

In some implementations, the model may be used in an enhanced energy efficient manner by first using measured radio signal information that has already been collected by the device (e.g., as part of its communications network activities) and/or that can be collected/looked up using the least amount of power. Depending on the results of using such information, further radio signal information may be obtained according to the power draw associated with such signaling. For example, in some embodiments, Bluetooth low energy (BLE) may consume the least power, then cellular signal lookups, then Wi-Fi scanning, and the finally GPS lookups. Accordingly, if the model produces a sufficiently confident prediction using existing radio signal measurements or low power measurements, then other higher powered communication signal lookups/scans may be skipped, thus further reducing the energy consumption of the determination process. For example, if a BLE signal measurement used as an input to the model results in a confident output of device location relative to the geofence, then obtaining other communication signal measurements (such as cellular, Wi-Fi) may be avoided. If the use of just the BLE signal measurements does not result in a confident output prediction, then other communication signal measurements (such as cellular or Wi-Fi) may be conducted and used as model input. In this way, more energy consuming lookups/scans may be skipped to converse battery.

Figure 2:
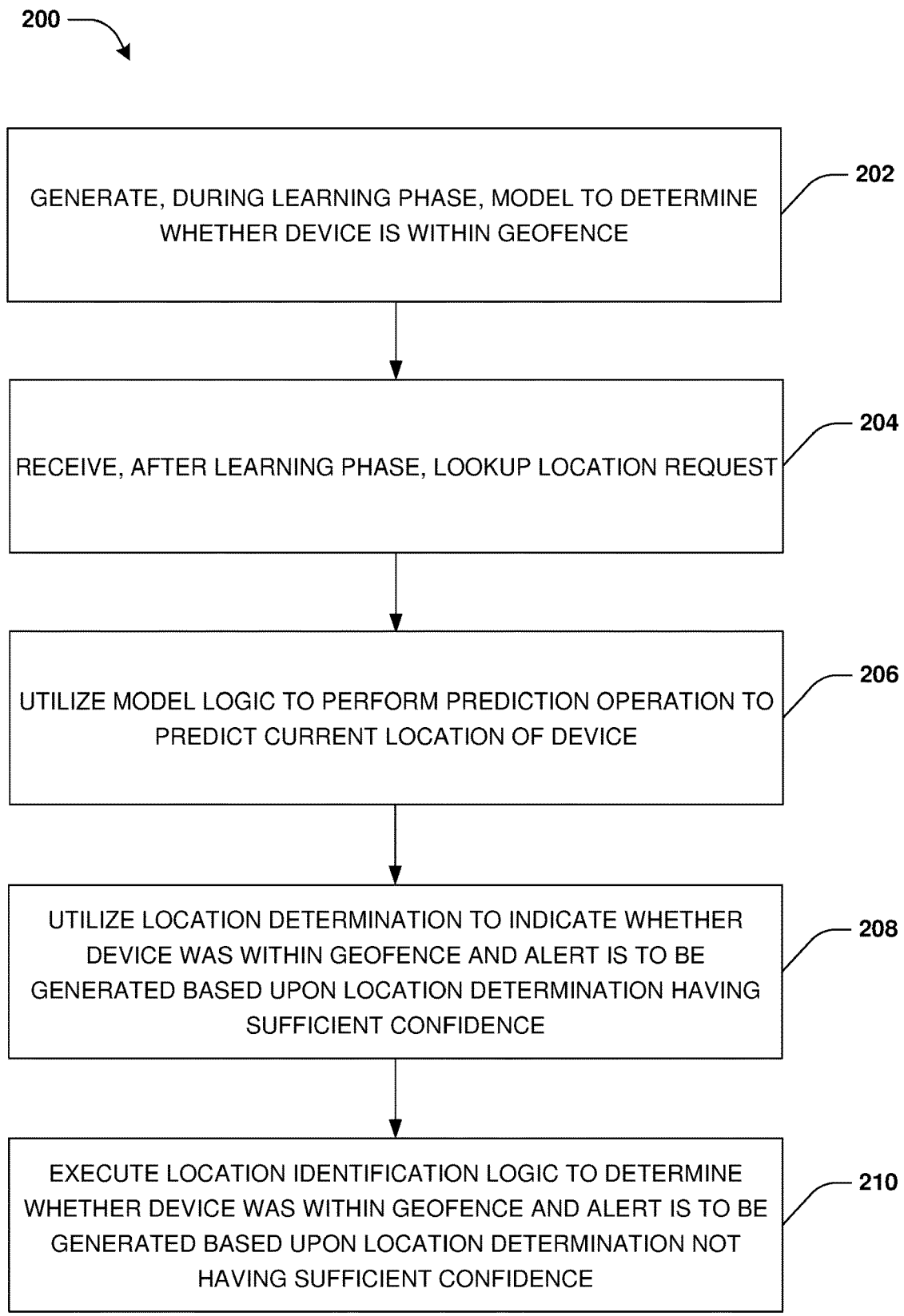
FIG. 2 is a flow chart illustrating an example method for low power geofencing, in accordance with an embodiment of the present technology.
Figure 3:
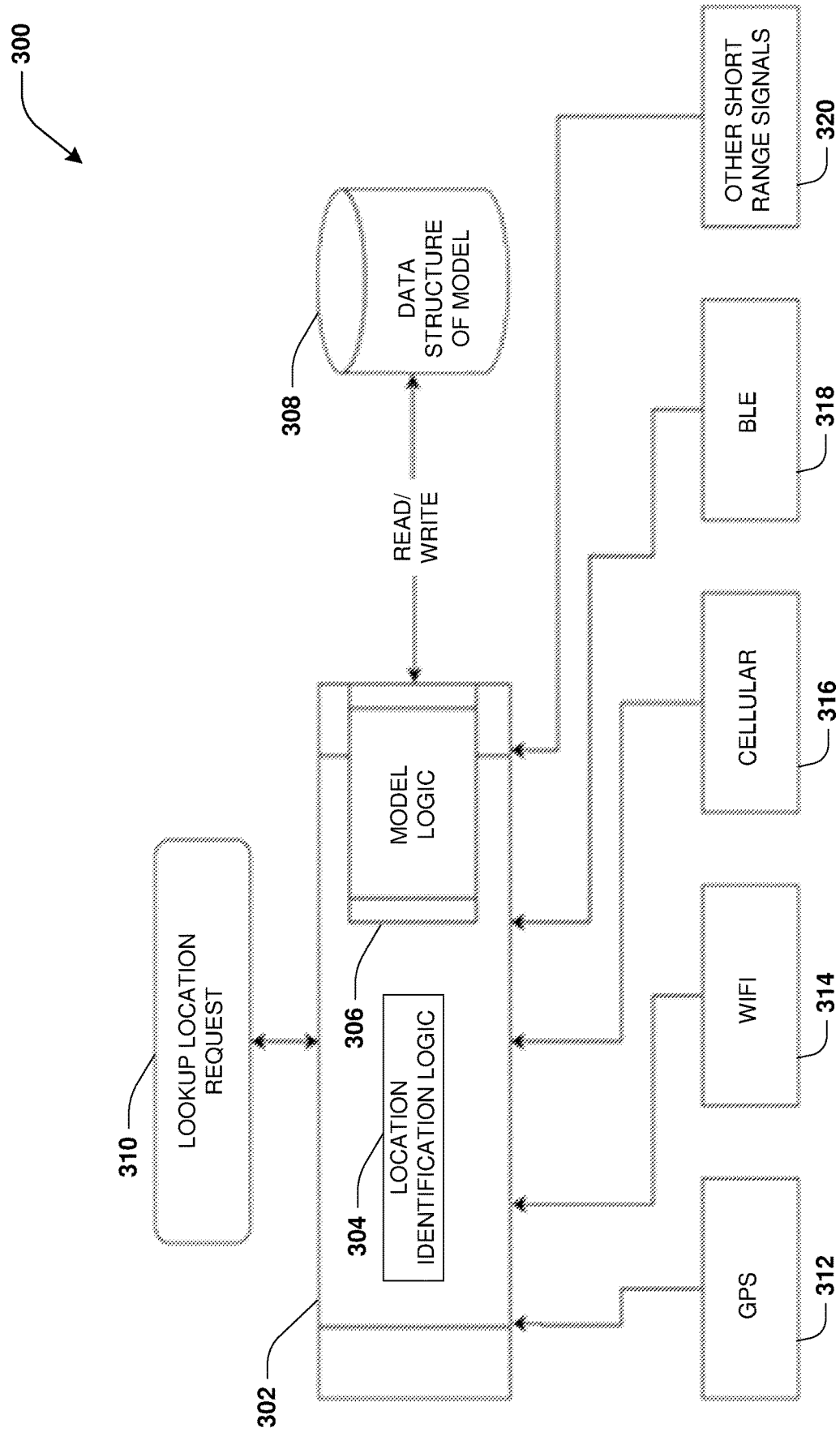
FIG. 3 illustrates an example of a system for low power geofencing, in accordance with an embodiment of the present technology.

FIG. 2 is a flow chart illustrating an example method 200 for low power geofencing, which is described in conjunction with system 300 of FIG. 3. The system 300 may be hosted on a device that provides geofence capabilities where a user can define a geofence such that an alert is provided to the user if the device is not within the geofence. The device may include a location determination component 302 configured to process lookup location requests, such as a lookup location request 310 from a geofence module for a current location of the device used to determine whether the device is within or outside the geofence. The location determination component 302 may include location identification logic 304 configured to utilize signal information for identifying the current location of the device. Because the location identification logic 304 may consume a significant amount of energy and thus battery consumption, a model 306 is generated during a learning phase from data stored in data structure 308 for subsequently identifying, in a low power and battery conservative manner, whether the device is within the geofence.

During operation 202 of FIG. 2, the learning phase is performed to generate the model so that the model logic 306 can use signal information within the data structure 308 to detect when the device is within the geofence. As part of the learning phase, the location identification logic 304 is used to process lookup location requests using signal information, such as local wireless network signals such as Wi-Fi signals 314 and Bluetooth signals 318, cellular signals 316, and/or other short-range signals 320. For example, in response to receiving the lookup location request 310 during the learning phase, the location identification logic 304 is executed to sequentially evaluate signal information until a current location of the device is identified within an accuracy threshold (e.g., a distance accuracy within 100 m or less).

In some embodiments of executing the location identification logic 304, the location identification logic 304 may first obtain the global positioning system signals 312. If an accuracy of the global positioning system signals 312 is within the accuracy threshold, then the global positioning system signals 312 are used by the location identification logic 304 to determine the current location of the device. The current location of the device is used by the geofence module to determine whether the device is within or outside the geofence. If the accuracy of the global positioning system signals 312 is not within the accuracy threshold or the global positioning system signals 312 are not available, then the location identification logic 304 obtains the Wi-Fi signals 314. The Wi-Fi signals 314 are used to identify geographic coordinates, such as where a Wi-Fi signal is converted to latitude and longitude coordinates from a Wi-Fi location database (e.g., a third-party Wi-Fi location database). If an accuracy of the geographic coordinates derived from the Wi-Fi signals 314 is within the accuracy threshold, then the geographic coordinates derived from the Wi-Fi signals 314 are used by the location identification logic 304 to determine the current location of the device. The current location of the device is used by the geofence component to determine whether the device is within or outside the geofence.

If the accuracy of the geographic coordinates derived from the Wi-Fi signals 314 are not within the accuracy threshold or there are no detected wireless network signals, then the location identification logic 304 obtains the cellular signals 316. The cellular signals 316 are used to retrieve location assistance data from a service or server such as a secure user plane location (SUPL) server. If an accuracy of the location assistance data is within the accuracy threshold, then the location assistance data is used by the location identification logic 304 to determine the current location of the device. The current location of the device is used by the geofence module to determine whether the device is within or outside the geofence. It may be appreciated that the location identification logic 304 may also utilize other types of signals such as the Bluetooth signals 318 or the other short-range signals 320 for identifying the current location of the device as part of its location determination sequence.

Figure 5:
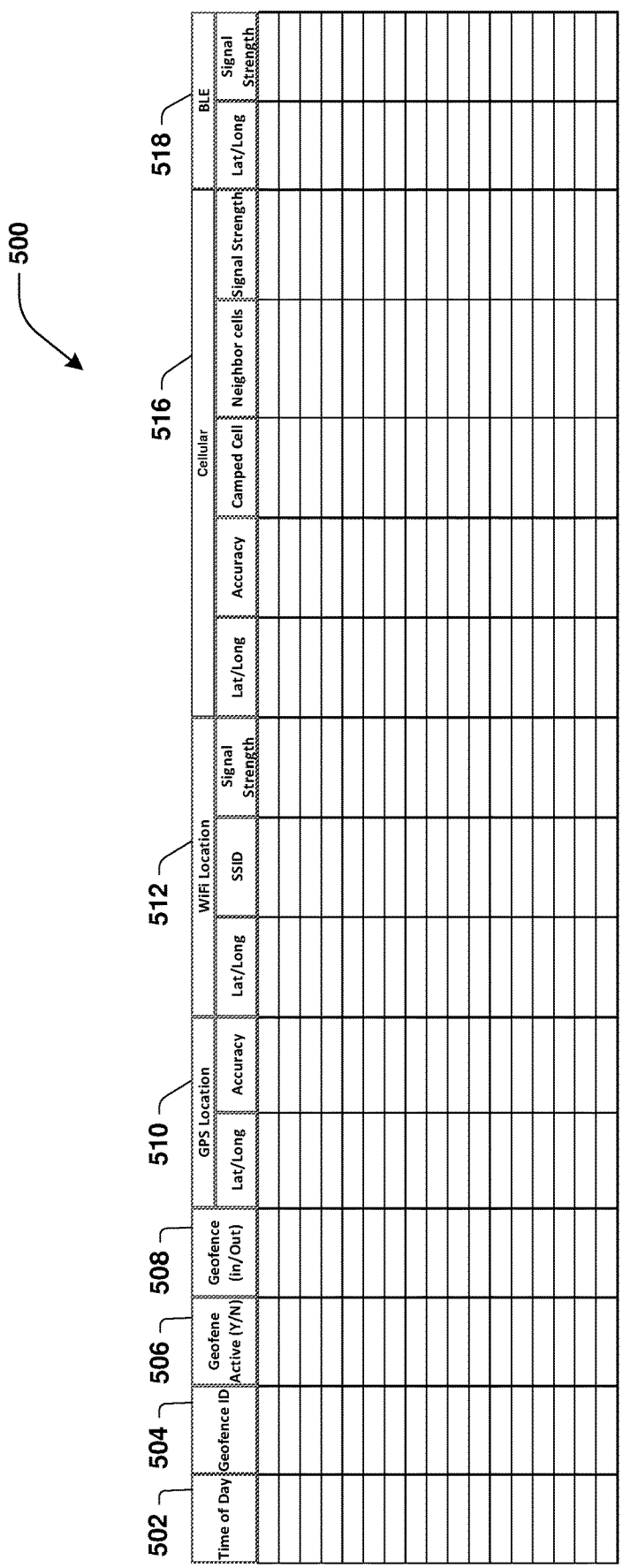
FIG. 5 is an illustration of an example data structure used in low power consumption geofencing, in accordance with an embodiment of the present technology.

During the learning phase, the radio signal information obtained by the device is recorded within the data structure 308 for subsequent use in training the model. The information stored in the data structure 308 will be dependent on the available radio signal information in the device's environment and its available facilities for receiving those signals. One example of a potential data structure is shown in FIG. 5 as data structure 500. In some embodiments, the radio signal information stored in the data structure includes cellular network information 516 such as: a cell identifier of a serving cell ("camped cell") to which the device is connected (e.g., cellular network communication equipment), signal strength data between the device and the serving cell, a neighboring cell identifier of a neighboring cell that is a neighbor of a serving cell with which the device is connected, signal strength data between the device and the neighboring cell, and/or geographic coordinates determined using the cellular signal position determination facility. In some embodiments, the information stored in data structure 500 includes Wi-Fi signal information 512 such as: a service set identifier (SSID) from a Wi-Fi access point, signal strength data of a received Wi-Fi radio signal, and/or geographic coordinates determined using a local wireless position determination facility. In some embodiments, the information stored in data structure 500 includes global positioning system signal information 510 such as geographic coordinates and/or accuracy information. In some embodiments, the information stored in data structure 500 includes Bluetooth signal information 518 such as a Bluetooth ID, signal strength data of the signal received from the Bluetooth device, and/or geographic coordinates determined from a Bluetooth position determination facility.

In some implementations, a timestamp 502 is included, which may be useful to determine an age of the entry. In some implementations, a geofence identifier 504 for the geofence for which the information was obtained is stored. In some implementations, an active indicator 506 is stored for whether the geofence was active at the time of measurement. In some implementations, an indicator 508 as to whether the device was determined to be inside or outside the geofence is stored in data structure 500

In some embodiments, the learning phase may complete once a threshold number of entries are added into the data structure 308 (e.g., 50 entries or any other number of entries). In some embodiments, the device is transitioned to using the model and the data structure 308 in response to a confirmation that the device has been at a location for a specified time (e.g., the device has remained in the same location or remained within a location inside the geofence for an hour or some other specified time).

During operation 204 of FIG. 2, a lookup location request may be received subsequent to the learning phase by the location determination component 302 from the geofence module. During operation 206 of FIG. 2, the model logic 306 may perform a prediction operation to predict the current location of the device. The prediction operation may include different components depending on the form of the model. For example, where the model takes the form of a structured arrangement of the radio signal information (and possibly geofence determinations), the prediction operation may include a searching operation that traverses the model structure to locate a best match between current communication signals (e.g., Wi-Fi signal information, cellular signal information, Bluetooth signal information, etc.) and previously measured location determinations. Where the model takes the form of a machine learning algorithm, the prediction operation may include using one or more of the current communication signals as inputs to generate an output prediction of the device location (e.g., its coordinates and/or whether it is within the geofence).

The model logic 306 can be used to perform the prediction process in an enhanced energy efficient manner by first using communication signals that can be collected/looked up using the least amount of power before attempting other communication signals. If a prediction with sufficient confidence is found with respect to a lower powered communication signal lookup/scan, then other higher powered communication signal lookups/scans may be skipped, thus reducing the energy consumption of the location determination process. In some embodiments, Bluetooth low energy (BLE) may consume the least power, then cellular signal lookups, then Wi-Fi scanning. Accordingly, if a prediction using BLE signals has sufficient confidence, then other communication signal lookups/scans may be skipped such as cellular and Wi-Fi. If the prediction using BLE signals is not found to have sufficient confidence, then cellular signals may be used for the prediction, and if that produces a location determination with sufficient confidence, then other communication signal lookups/scans may be skipped such as Wi-Fi. In this way, more energy consuming lookups/scans may be skipped to converse battery.

If the current communication signals produce a location determination with sufficient confidence, the location determination may be used to indicate whether the device was within the geofence when the signal information was collected (operation 208 of FIG. 2). If the model does not identify a location determination with sufficient confidence, then the location identification logic 304 is executed to determine whether the device is within the geofence (operation 210 of FIG. 2). In some implementations, if the location identification logic 304 is used due to an insufficient location determination by the model, then the current signal information may be populated as an entry into the data structure for subsequent use in model training.

Figure 4:
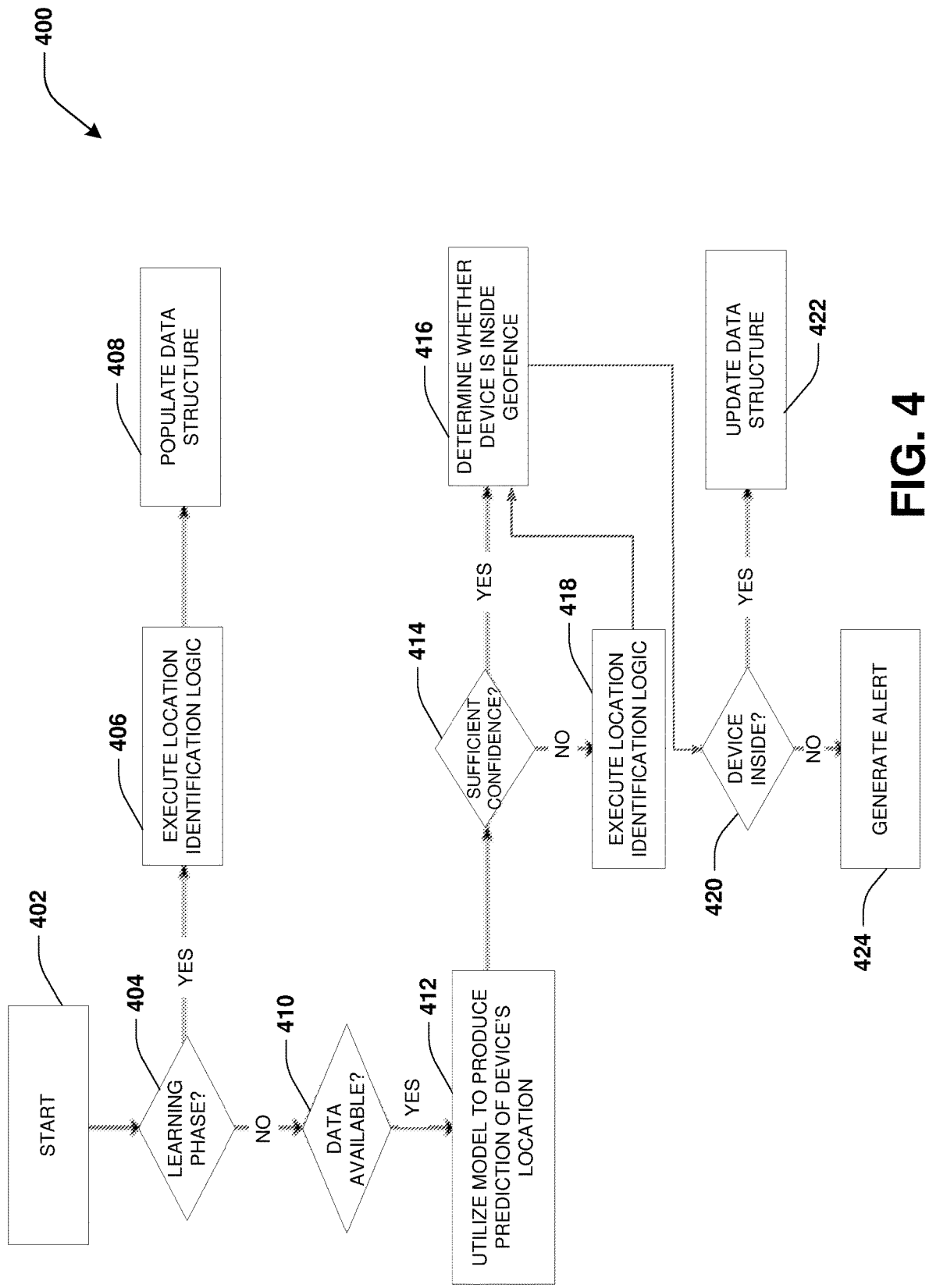
FIG. 4 is a flow chart illustrating an example method for low power geofencing, in accordance with an embodiment of the present technology.

FIG. 4 is a flow chart illustrating an example method 400 for low power geofencing. During operation 402 of method 400, a lookup location request is received. During operation 404 of method 400, a determination is made as to whether a learning phase is to be performed or is currently being performed. If the learning phase is to be performed or is currently being performed, then location identification logic sequentially evaluates signal information until a current location is identified within an accuracy threshold, during operation 406 of method 400. The current location is used to determine whether the device is within or outside a geofence. The signal information is populated into an entry within a training data structure, during operation 408 of method 400.

If the learning phase is not to be performed, such as where the learning phase was previously completed, then a check is performed to determine whether there are current communications signals data available for determining whether the device is within or outside the geofence, during operation 410 of method 400. If the data is available, then a model is used with the current communication signals to produce a prediction of the device's location, during operation 412 of method 400. During operation 414 of method 400, a determination is made as to whether the prediction has sufficient confidence. If the model prediction is determined to have sufficient confidence, then the predicted location determination is used to determine whether the device is with the geofence, during operation 416 of method 400. If the model does not produce a location prediction with sufficient confidence, then location identification logic is executed, during operation 418 of method 400, to determine the device's current location. The location determined from the location identification logic is then used to determine if the device is within or outside the geofence, during operation 416 of method 400.

If the location identification logic determines (operation 420 of method 400) that the device is outside the geofence, then an alert is generated, during operation 424 of method 400. In some implementations, if the location identification logic determines that the device is within the geofence, then the signal information is used to update the training data structure, during operation 422 of method 400. This may be useful for future training operations.

According to some embodiments, a method is provided. The method includes generating, during a learning phase, a model to determine whether a device is within a geofence, wherein the generating the model comprises: in response to receiving a first lookup location request, determining a first device location using location identification logic, wherein the location identification logic includes a relatively high-power location determination facility and a relatively low-power location determination facility, and wherein the relatively high-power location determination facility is used to determine the first device location; determining whether the device is within the geofence based on the first device location, receiving first radio signal information associated with the relatively low power location determination facility, the first radio signal information not used by the relatively high-power location determination facility, recording the first radio signal information and whether the device is within the geofence in a training data structure, and performing a training operation using the training data structure to create the model; in response to receiving, after the learning phase, a second lookup location request, utilizing the model to determine whether the device is within the geofence by: using second radio signal information measured by the device as model inputs to generate a model output that indicates whether the device is within the geofence, the second radio signal information not used by the relatively high-power location determination facility, determining a confidence level associated with the model output; if the confidence level is below a threshold, determining a second device location using the location identification logic, and determining whether the device is within the geofence based on the second device location.

According to some embodiments, the method includes in response to determining that the device is outside the geofence, generating an alert that is transmitted to a remote device.

According to some embodiments, the high-power location determination facility is a global positioning service (GPS) component.

According to some embodiments, determining the first device location using the location identification logic includes using the relatively low-power location determination facility to determine the first device location when the relatively high-power location facility produces a low accuracy result.

According to some embodiments, the first radio signal information includes at least one of: Wi-Fi radio signal strength data, Wi-Fi service set identifiers (SSID), cellular network serving cell signal strength data, cellular network serving cell identifiers, cellular network neighboring cell signal strength data, cellular network neighboring cell identifiers, Bluetooth signal strength data, or Bluetooth identifiers.

According to some embodiments, the generating the model further includes: ending the learning phase after the occurrence of an event, where the event is one of: determining that a threshold number of radio signal information has been recorded in the training data structure; determining that the device has been at a location for a specified duration; or determining that a confidence level of a model output exceeds a threshold confidence level.

According to some embodiments, the model is one of a searchable data structure or a machine learning algorithm trained using the training data structure.

According to some embodiments, the model is a searchable data structure, and the method further comprises: when the second device location is determined to be within the geofence, updating the training data structure with the second radio signal information.

According to some embodiments, the model is a machine learning model that includes at least one of a Decision Tree, Support Vector Machine, Linear Regression, Random Forest or K-Nearest Neighbor model, and wherein performing a training operation includes performing a supervised learning operation using the training data structure.

According to some embodiments, a system comprising one or more processors configured for executing the instructions to perform operations, is provided. The operations include generating, during a learning phase, a model to determine whether a device is within a geofence, wherein the generating the model comprises: in response to receiving a first lookup location request, determining a first device location using location identification logic, wherein the location identification logic includes a relatively high-power location determination facility and a relatively low-power location determination facility, and wherein the relatively high-power location determination facility is used to determine the first device location; determining whether the device is within the geofence based on the first device location, receiving first radio signal information associated with the relatively low power location determination facility, the first radio signal information not used by the relatively high-power location determination facility, recording the first radio signal information and whether the device is within the geofence in a training data structure, and performing a training operation using the training data structure to create the model; in response to receiving, after the learning phase, a second lookup location request, utilizing the model to determine whether the device is within the geofence by: using second radio signal information measured by the device as model inputs to generate a model output that indicates whether the device is within the geofence, the second radio signal information not used by the relatively high-power location determination facility, determining a confidence level associated with the model output; if the confidence level is below a threshold, determining a second device location using the location identification logic, and determining whether the device is within the geofence based on the second device location.

According to some embodiments, the operations further comprise: in response to determining that the device is outside the geofence, generating an alert that is transmitted to a remote device.

According to some embodiments, the high-power location determination facility is a global positioning service (GPS) component.

According to some embodiments, determining the first device location using the location identification logic includes using the relatively low-power location determination facility to determine the first device location when the relatively high-power location facility produces a low accuracy result.

According to some embodiments, the first radio signal information includes at least one of: Wi-Fi radio signal strength data, Wi-Fi service set identifiers (SSID), cellular network serving cell signal strength data, cellular network serving cell identifiers, cellular network neighboring cell signal strength data, cellular network neighboring cell identifiers, Bluetooth signal strength data, or Bluetooth identifiers.

According to some embodiments, generating the model further includes: ending the learning phase after the occurrence of an event, where the event is one of: determining that a threshold number of radio signal information has been recorded in the training data structure; determining that the device has been at a location for a specified duration; or determining that a confidence level of a model output exceeds a threshold confidence level.

According to some embodiments, the model is a searchable data structure, and wherein the operations further comprise: when the second device location is determined to be within the geofence, updating the training data structure with the second radio signal information.

According to some embodiments, the model is a machine learning model that includes at least one of a Decision Tree, Support Vector Machine, Linear Regression, Random Forest or K-Nearest Neighbor model, and wherein performing a training operation includes performing a supervised learning operation using the training data structure.

According to some embodiments, a non-transitory computer-readable medium storing instructions that when executed facilitate performance of operations, is provided. The operations include generating, during a learning phase, a model to determine whether a device is within a geofence, wherein the generating the model comprises: in response to receiving a first lookup location request, determining a first device location using location identification logic, wherein the location identification logic includes a relatively high-power location determination facility and a relatively low-power location determination facility, and wherein the relatively high-power location determination facility is used to determine the first device location; determining whether the device is within the geofence based on the first device location, receiving first radio signal information associated with the relatively low power location determination facility, the first radio signal information not used by the relatively high-power location determination facility, recording the first radio signal information and whether the device is within the geofence in a training data structure, and performing a training operation using the training data structure to create the model; in response to receiving, after the learning phase, a second lookup location request, utilizing the model to determine whether the device is within the geofence by: using second radio signal information measured by the device as model inputs to generate a model output that indicates whether the device is within the geofence, the second radio signal information not used by the relatively high-power location determination facility, determining a confidence level associated with the model output; if the confidence level is below a threshold, determining a second device location using the location identification logic, and determining whether the device is within the geofence based on the second device location.

According to some embodiments, the high-power location determination facility is a global positioning service (GPS) component, and wherein determining the first device location using the location identification logic includes using the relatively low power location determination facility to determine the first device location when the GPS component produces a low accuracy result.

According to some embodiments, the model is one of a searchable data structure or a machine learning algorithm trained using the training data structure, and: when the model is a searchable data structure, and the second device location is determined to be within the geofence, updating the training data structure with the second radio signal information; and when the model is a machine learning algorithm, performing the training operation includes performing a supervised learning operation using the training data structure.

Figure 6:
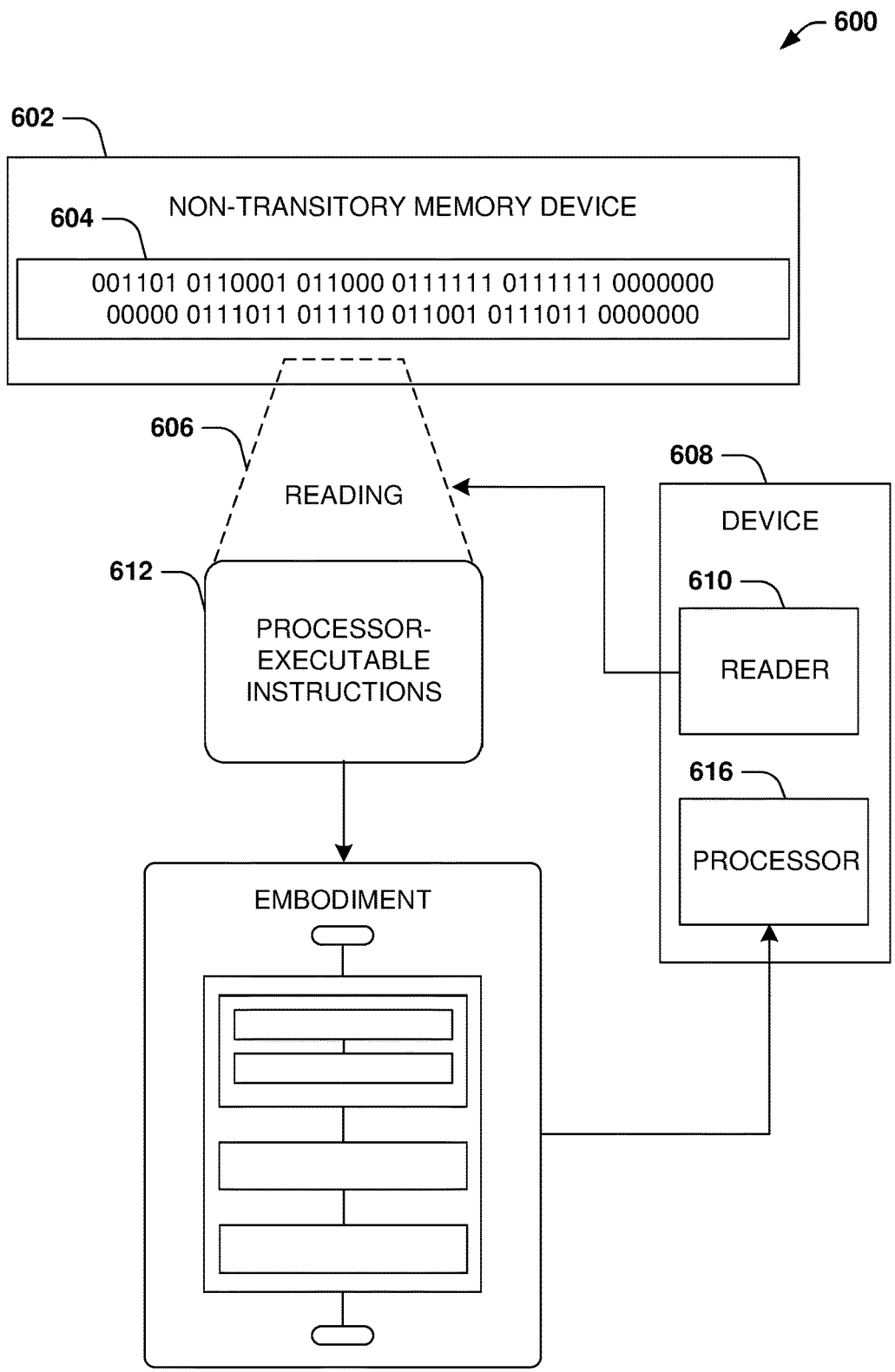
FIG. 6 is an illustration of example networks that may utilize and/or implement at least a portion of the techniques presented herein.

FIG. 6 is an illustration of a scenario 600 involving an example non-transitory machine readable medium 602. The non-transitory machine readable medium 602 may comprise processor-executable instructions 612 that when executed by a processor 616 cause performance (e.g., by the processor 616) of at least some of the provisions herein. The non-transitory machine readable medium 602 may comprise a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a compact disk (CD), a digital versatile disk (DVD), or floppy disk). The example non-transitory machine readable medium 602 stores computer-readable data 604 that, when subjected to reading 606 by a reader 610 of a device 608 (e.g., a read head of a hard disk drive, or a read operation invoked on a solid-state storage device), express the processor-executable instructions 612. In some embodiments, the processor-executable instructions 612, when executed cause performance of operations, such as at least some of the example method 200 of FIG. 2 and/or at least some of the example method 400 of FIG. 4, for example. In some embodiments, the processor-executable instructions 612 are configured to cause implementation of a system, such as at least some of the example system 100 of FIGS. 1A-1B and/or at least some of the example system 300 of FIG. 3.

Figure 7:
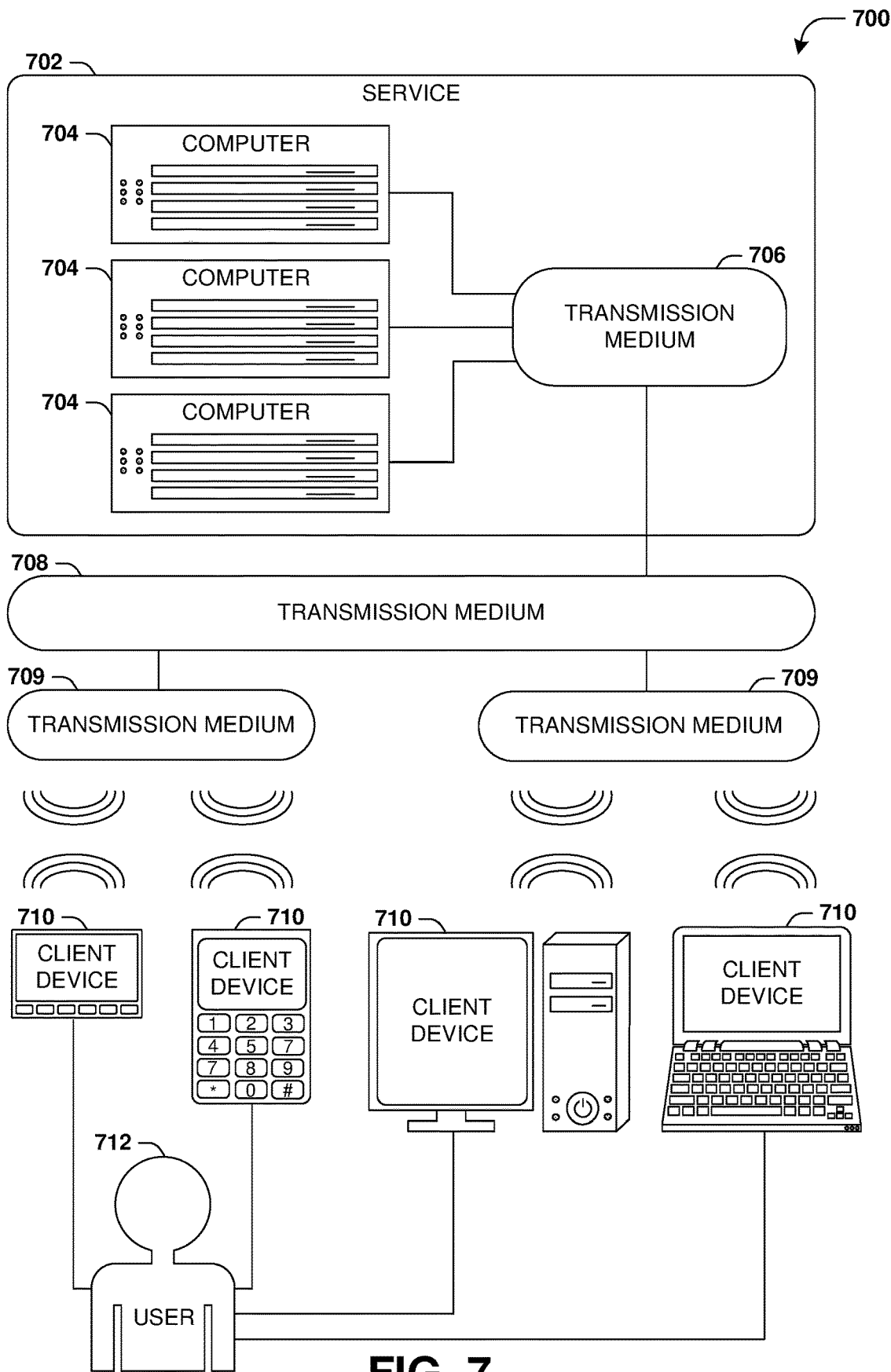
FIG. 7 is an illustration of a scenario involving an example configuration of a computer that may utilize and/or implement at least a portion of the techniques presented herein.

FIG. 7 is an interaction diagram of a scenario 700 illustrating a service 702 provided by a set of computers 704 to a set of client devices 710 via various types of transmission mediums. The computers 704 and/or client devices 710 may be capable of transmitting, receiving, processing, and/or storing many types of signals, such as in memory as physical memory states.

In some embodiments, the computers 704 may be host devices and/or the client device 710 may be devices attempting to communicate with the computer 704 over buses for which device authentication for bus communication is implemented.

The computers 704 of the service 702 may be communicatively coupled together, such as for exchange of communications using a transmission medium 706. The transmission medium 706 may be organized according to one or more network architectures, such as computer/client, peer-to-peer, and/or mesh architectures, and/or a variety of roles, such as administrative computers, authentication computers, security monitor computers, data stores for objects such as files and databases, business logic computers, time synchronization computers, and/or front-end computers providing a user-facing interface for the service 702.

Likewise, the transmission medium 706 may comprise one or more sub-networks, such as may employ different architectures, may be compliant or compatible with differing protocols and/or may interoperate within the transmission medium 706. Additionally, various types of transmission medium 706 may be interconnected (e.g., a router may provide a link between otherwise separate and independent transmission medium 706).

In scenario 700 of FIG. 7, the transmission medium 706 of the service 702 is connected to a transmission medium 708 that allows the service 702 to exchange data with other services 702 and/or client devices 710. The transmission medium 708 may encompass various combinations of devices with varying levels of distribution and exposure, such as a public wide-area network and/or a private network (e.g., a virtual private network (VPN) of a distributed enterprise).

In the scenario 700 of FIG. 7, the service 702 may be accessed via the transmission medium 708 by a user 712 of one or more client devices 710, such as a portable media player (e.g., an electronic text reader, an audio device, or a portable gaming, exercise, or navigation device); a portable communication device (e.g., a camera, a phone, a wearable or a text chatting device); a workstation; and/or a laptop form factor computer. The respective client devices 710 may communicate with the service 702 via various communicative couplings to the transmission medium 708. As a first such example, one or more client devices 710 may comprise a cellular communicator and may communicate with the service 702 by connecting to the transmission medium 708 via a transmission medium 709 provided by a cellular provider. As a second such example, one or more client devices 710 may communicate with the service 702 by connecting to the transmission medium 708 via a transmission medium 709 provided by a location such as the user's home or workplace (e.g., a Wi-Fi (Institute of Electrical and Electronics Engineers (IEEE) Standard 802.11) network or a Bluetooth (IEEE Standard 802.15.1) personal area network). In this manner, the computers 704 and the client devices 710 may communicate over various types of transmission mediums.

Figure 8:
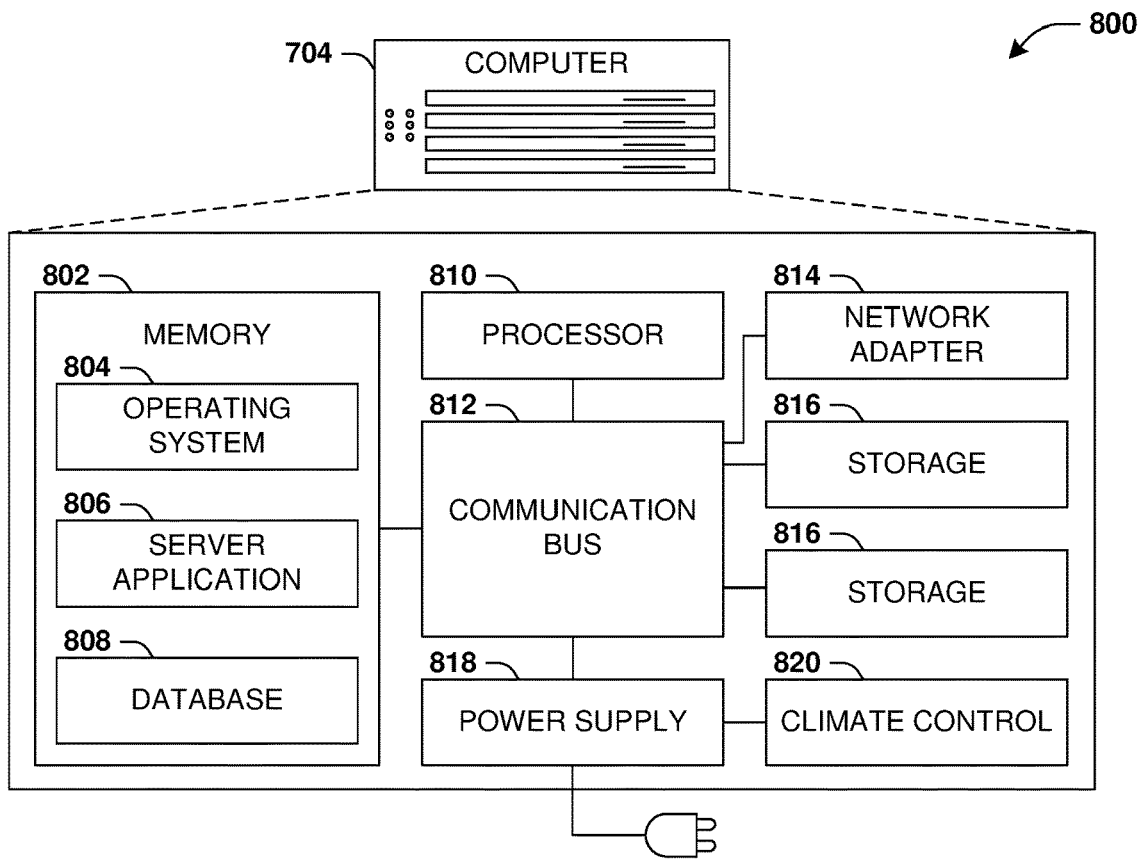
FIG. 8 is an illustration of a scenario involving an example configuration of a client that may utilize and/or implement at least a portion of the techniques presented herein.

FIG. 8 presents a schematic architecture diagram 800 of a computer 704 that may utilize at least a portion of the techniques provided herein. Such a computer 704 may vary widely in configuration or capabilities, alone or in conjunction with other computers, in order to provide a service.

The computer 704 may comprise one or more processors 810 that process instructions. The one or more processors 810 may optionally include a plurality of cores; one or more coprocessors, such as a mathematics coprocessor or an integrated graphical processing unit (GPU); and/or one or more layers of local cache memory. The computer 704 may comprise memory 802 storing various forms of applications, such as an operating system 804; one or more computer applications 806; and/or various forms of data, such as a database 808 or a file system. The computer 704 may comprise a variety of peripheral components, such as a wired and/or wireless network adapter 814 connectible to a local area network and/or wide area network; one or more storage components 816, such as a hard disk drive, a solid-state storage device (SSD), a flash memory device, and/or a magnetic and/or optical disk reader.

The computer 704 may comprise a mainboard featuring one or more communication buses 812 that interconnect the processor 810, the memory 802, and various peripherals, using a variety of bus technologies, such as a variant of a serial or parallel AT Attachment (ATA) bus protocol; a Uniform Serial Bus (USB) protocol; and/or Small Computer System Interface (SCI) bus protocol. In a multibus scenario, a communication bus 812 may interconnect the computer 704 with at least one other computer. Other components that may optionally be included with the computer 704 (though not shown in the schematic architecture diagram 800 of FIG. 8) include a display; a display adapter, such as a graphical processing unit (GPU); input peripherals, such as a keyboard and/or mouse; and a flash memory device that may store a basic input/output system (BIOS) routine that facilitates booting the computer 704 to a state of readiness.

The computer 704 may operate in various physical enclosures, such as a desktop or tower, and/or may be integrated with a display as an "all-in-one" device. The computer 704 may be mounted horizontally and/or in a cabinet or rack, and/or may simply comprise an interconnected set of components. The computer 704 may comprise a dedicated and/or shared power supply 818 that supplies and/or regulates power for the other components. The computer 704 may provide power to and/or receive power from another computer and/or other devices. The computer 704 may comprise a shared and/or dedicated climate control unit 820 that regulates climate properties, such as temperature, humidity, and/or airflow. Many such computers 704 may be configured and/or adapted to utilize at least a portion of the techniques presented herein.

Figure 9:
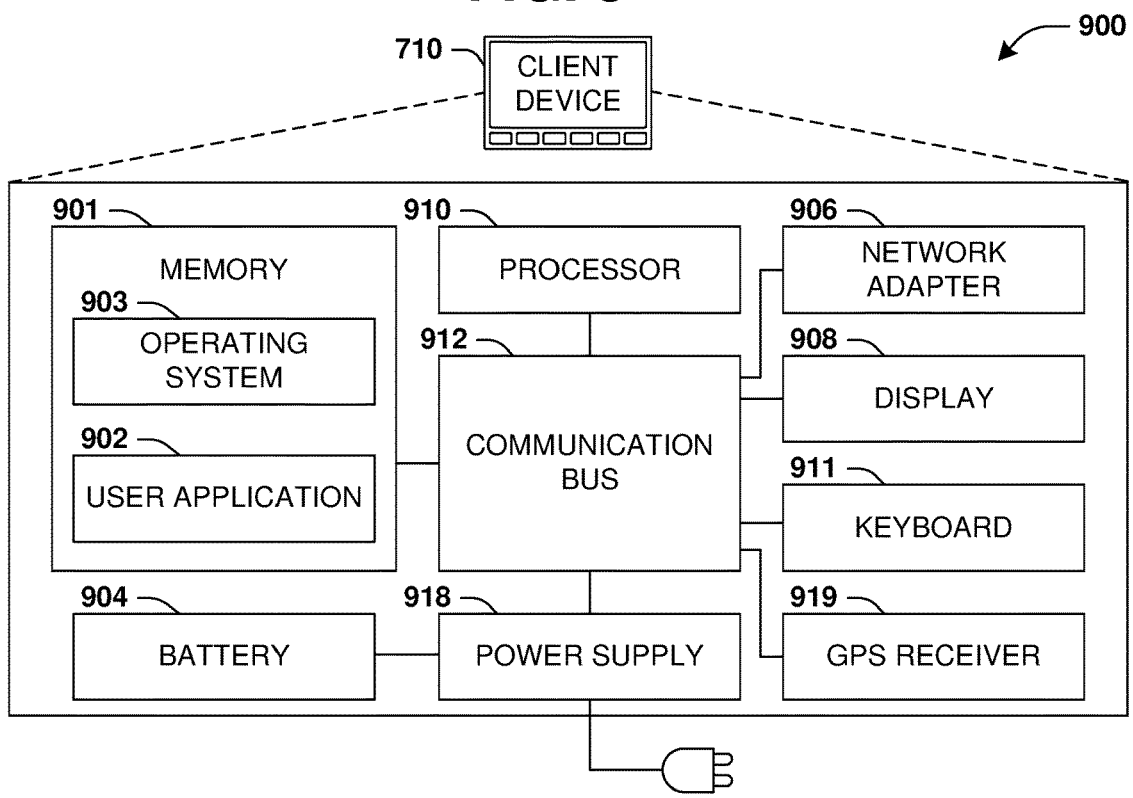
FIG. 9 is an illustration of a scenario featuring an example non-transitory machine readable medium in accordance with one or more of the provisions set forth herein.

FIG. 9 presents a schematic architecture diagram 900 of a client device 710 whereupon at least a portion of the techniques presented herein may be implemented. Such a client device 710 may vary widely in configuration or capabilities, in order to provide a variety of functionality to a user such as the user 712. The client device 710 may be provided in a variety of form factors, such as a desktop or tower workstation; an "all-in-one" device integrated with a display 908; a laptop, tablet, convertible tablet, or palmtop device; a wearable device mountable in a headset, eyeglass, earpiece, and/or wristwatch, and/or integrated with an article of clothing; and/or a component of a piece of furniture, such as a tabletop, and/or of another device, such as a vehicle or residence. The client device 710 may serve the user in a variety of roles, such as a workstation, kiosk, media player, gaming device, and/or appliance.

The client device 710 may comprise one or more processors 910 that process instructions. The one or more processors 910 may optionally include a plurality of cores; one or more coprocessors, such as a mathematics coprocessor or an integrated graphical processing unit (GPU); and/or one or more layers of local cache memory. The client device 710 may comprise memory 901 storing various forms of applications, such as an operating system 903; one or more user applications 902, such as document applications, media applications, file and/or data access applications, communication applications such as web browsers and/or email clients, utilities, and/or games; and/or drivers for various peripherals. The client device 710 may comprise a variety of peripheral components, such as a wired and/or wireless network adapter 906 connectible to a local area network and/or wide area network; one or more output components, such as a display 908 coupled with a display adapter (optionally including a graphical processing unit (GPU)), a sound adapter coupled with a speaker, and/or a printer; input devices for receiving input from the user, such as a keyboard 911, a mouse, a microphone, a camera, and/or a touch-sensitive component of the display 908; and/or environmental sensors, such as a global positioning system (GPS) receiver 919 that detects the location, velocity, and/or acceleration of the client device 710, a compass, accelerometer, and/or gyroscope that detects a physical orientation of the client device 710. Other components that may optionally be included with the client device 710 (though not shown in the schematic architecture diagram 900 of FIG. 9) include one or more storage components, such as a hard disk drive, a solid-state storage device (SSD), a flash memory device, and/or a magnetic and/or optical disk reader; and/or a flash memory device that may store a basic input/output system (BIOS) routine that facilitates booting the client device 710 to a state of readiness; and a climate control unit that regulates climate properties, such as temperature, humidity, and airflow.

The client device 710 may comprise a mainboard featuring one or more communication buses 912 that interconnect the processor 910, the memory 901, and various peripherals, using a variety of bus technologies, such as a variant of a serial or parallel AT Attachment (ATA) bus protocol; the Uniform Serial Bus (USB) protocol; and/or the Small Computer System Interface (SCI) bus protocol. The client device 710 may comprise a dedicated and/or shared power supply 918 that supplies and/or regulates power for other components, and/or a battery 904 that stores power for use while the client device 710 is not connected to a power source via the power supply 918. The client device 710 may provide power to and/or receive power from other client devices.

As used in this application, "component," "module," "system", "interface", and/or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an example, instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Various operations of embodiments are provided herein. In an embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering may be implemented without departing from the scope of the disclosure. Further, it will be understood that not all operations are necessarily present in each embodiment provided herein. Also, it will be understood that not all operations are necessary in some embodiments.

Also, although the disclosure has been shown and described with respect to one or more implementations, alterations and modifications may be made thereto and additional embodiments may be implemented based upon a reading and understanding of this specification and the annexed drawings. The disclosure includes all such modifications, alterations and additional embodiments and is limited only by the scope of the following claims. The specification and drawings are accordingly to be regarded in an illustrative rather than restrictive sense. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense. To the extent the aforementioned implementations collect, store, or employ personal information of individuals, groups or other entities, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various access control, encryption and anonymization techniques for particularly sensitive information.

What is claimed:

1. A method, comprising:
  generating, during a learning phase, a model to determine whether a device is within a geofence, wherein the generating the model comprises:
    in response to receiving a first lookup location request, determining a first device location using location identification logic, wherein the location identification logic includes a relatively high-power location determination facility and a relatively low-power location determination facility, and wherein the relatively high-power location determination facility is used to determine the first device location,
    determining whether the device is within the geofence based on the first device location,
    receiving first radio signal information associated with the relatively low-power location determination facility, the first radio signal information not used by the relatively high-power location determination facility, and recording the first radio signal information and whether the device is within the geofence in a training data structure, and performing a training operation using the training data structure to create the model;

in response to receiving, after the learning phase, a second lookup location request, utilizing the model to determine whether the device is within the geofence by:

using second radio signal information measured by the device as model inputs to generate a model output that indicates whether the device is within the geofence, the second radio signal information not used by the relatively high-power location determination facility, and determining a confidence level associated with the model output; and if the confidence level is below a threshold, determining a second device location using the location identification logic, and determining whether the device is within the geofence based on the second device location.

2. The method of claim 1, further comprising:

in response to determining that the device is outside the geofence, generating an alert that is transmitted to a remote device.

3. The method of claim 1, where the relatively high-power location determination facility is a global positioning service (GPS) component.

4. The method of claim 1, wherein determining the first device location using the location identification logic includes using the relatively low-power location determination facility to determine the first device location when the relatively high-power location determination facility produces a low accuracy result.

5. The method of claim 1, wherein the first radio signal information includes at least one of:

Wi-Fi radio signal strength data,
Wi-Fi service set identifiers (SSID),
cellular network serving cell signal strength data,
cellular network serving cell identifiers,
cellular network neighboring cell signal strength data,
cellular network neighboring cell identifiers,
Bluetooth signal strength data, or
Bluetooth identifiers.

6. The method of claim 1, wherein generating the model further includes:

ending the learning phase after the occurrence of an event, where the event is one of:

determining that a threshold number of radio signal information has been recorded in the training data structure;

determining that the device has been at a location for a specified duration; or determining that a confidence level of a model output exceeds a threshold confidence level.

7. The method of claim 1, wherein the model is one of a searchable data structure or a machine learning algorithm trained using the training data structure.

8. The method of claim 1, wherein the model is a searchable data structure, and the method further comprises:

when the second device location is determined to be within the geofence, updating the training data structure with the second radio signal information.

9. The method of claim 1, wherein the model is a machine learning model that includes at least one of a Decision Tree, Support Vector Machine, Linear Regression, Random Forest or K-Nearest Neighbor model, and wherein performing a training operation includes performing a supervised learning operation using the training data structure.

10. A system, comprising:

one or more processors configured for executing instructions to perform operations comprising:

generating, during a learning phase, a model to determine whether a device is within a geofence, wherein the generating the model comprises:

in response to receiving a first lookup location request, determining a first device location using location identification logic, wherein the location identification logic includes a relatively high-power location determination facility and a relatively low-power location determination facility, and wherein the relatively high-power location determination facility is used to determine the first device location, determining whether the device is within the geofence based on the first device location, receiving first radio signal information associated with the relatively low-power location determination facility, the first radio signal information not used by the relatively high-power location determination facility, recording the first radio signal information and whether the device is within the geofence in a training data structure, and performing a training operation using the training data structure to create the model;

in response to receiving, after the learning phase, a second lookup location request, utilizing the model to determine whether the device is within the geofence by:

using second radio signal information measured by the device as model inputs to generate a model output that indicates whether the device is within the geofence, the second radio signal information not used by the relatively high-power location determination facility, and determining a confidence level associated with the model output; and if the confidence level is below a threshold, determining a second device location using the location identification logic, and determining whether the device is within the geofence based on the second device location.

11. The system of claim 10, wherein the operations further comprise:

in response to determining that the device is outside the geofence, generating an alert that is transmitted to a remote device.

12. The system of claim 10, wherein the relatively high-power location determination facility is a global positioning service (GPS) component.

13. The system of claim 10, wherein determining the first device location using the location identification logic includes using the relatively low-power location determination facility to determine the first device location when the relatively high-power location determination facility produces a low accuracy result.

14. The system of claim 10, wherein the first radio signal information includes at least one of:

Wi-Fi radio signal strength data,
Wi-Fi service set identifiers (SSID),
cellular network serving cell signal strength data,
cellular network serving cell identifiers,
cellular network neighboring cell signal strength data, cellular network neighboring cell identifiers,
Bluetooth signal strength data, or
Bluetooth identifiers.

15. The system of claim 10, wherein generating the model further includes:
ending the learning phase after the occurrence of an event, where the event is one of:
determining that a threshold number of radio signal information has been recorded in the training data structure;
determining that the device has been at a location for a specified duration; or
determining that a confidence level of a model output exceeds a threshold confidence level.

16. The system of claim 10, wherein the model is a searchable data structure, and wherein the operations further comprise:
when the second device location is determined to be within the geofence, updating the training data structure with the second radio signal information.

17. The system of claim 10, wherein the model is a machine learning model that includes at least one of a Decision Tree, Support Vector Machine, Linear Regression, Random Forest or K-Nearest Neighbor model, and wherein performing a training operation includes performing a supervised learning operation using the training data structure.

18. A non-transitory computer-readable medium storing instructions that when executed facilitate performance of operations comprising:
generating, during a learning phase, a model to determine whether a device is within a geofence, wherein the generating the model comprises:
in response to receiving a first lookup location request, determining a first device location using location identification logic, wherein the location identification logic includes a relatively high-power location determination facility and a relatively low-power location determination facility, and wherein the relatively high-power location determination facility is used to determine the first device location,
determining whether the device is within the geofence based on the first device location,
receiving first radio signal information associated with the relatively low-power location determination facility, the first radio signal information not used by the relatively high-power location determination facility,
recording the first radio signal information and whether the device is within the geofence in a training data structure, and
performing a training operation using the training data structure to create the model;
in response to receiving, after the learning phase, a second lookup location request, utilizing the model to determine whether the device is within the geofence by:
using second radio signal information measured by the device as model inputs to generate a model output that indicates whether the device is within the geofence, the second radio signal information not used by the relatively high-power location determination facility, and
determining a confidence level associated with the model output; and
if the confidence level is below a threshold, determining a second device location using the location identification logic, and determining whether the device is within the geofence based on the second device location.

19. The non-transitory computer-readable medium of claim 18, wherein the relatively high-power location determination facility is a global positioning service (GPS) component, and wherein determining the first device location using the location identification logic includes using the relatively low power location determination facility to determine the first device location when the GPS component produces a low accuracy result.

20. The non-transitory computer-readable medium of claim 18, wherein the model is one of a searchable data structure or a machine learning algorithm trained using the training data structure, and:
when the model is a searchable data structure, and the second device location is determined to be within the geofence, updating the training data structure with the second radio signal information; and
when the model is a machine learning algorithm, performing the training operation includes performing a supervised learning operation using the training data structure.

* * * * *